(12) United States Patent
Huang et al.

(10) Patent No.: US 10,895,372 B2
(45) Date of Patent: Jan. 19, 2021

(54) LIGHT SOURCE BOARD, MANUFACTURING METHOD THEREOF, AND LUMINOUS KEYBOARD USING THE SAME

(71) Applicant: Darfon Electronics Corp., Taoyuan (TW)

(72) Inventors: Heng-Yi Huang, Taoyuan (TW); Hsin-Cheng Ho, Taoyuan (TW); Tsai-Yu Chen, Taoyuan (TW); Hung-Chuan Cheng, Taoyuan (TW)

(73) Assignee: Darfon Electronics Corp., Taoyuan (TW)

( * ) Notice: Subject to any disclaimer, the term of this patent is extended or adjusted under 35 U.S.C. 154(b) by 49 days.

(21) Appl. No.: 16/263,017

(22) Filed: Jan. 31, 2019

(65) Prior Publication Data
US 2019/0368706 A1 Dec. 5, 2019

Related U.S. Application Data

(63) Continuation-in-part of application No. 16/208,645, filed on Dec. 4, 2018, now Pat. No. 10,692,663.

(30) Foreign Application Priority Data

May 31, 2018 (TW) .............................. 107118699 A

(51) Int. Cl.
*H01H 13/83* (2006.01)
*F21V 23/00* (2015.01)
(Continued)

(52) U.S. Cl.
CPC .......... *F21V 23/004* (2013.01); *H01H 13/83* (2013.01); *H05K 1/0274* (2013.01); *H05K 1/03* (2013.01);
(Continued)

(58) Field of Classification Search
CPC .... H01H 1/0206; H01H 1/023; H01H 11/048; H01H 1/02376; H01H 1/0237;
(Continued)

(56) References Cited

U.S. PATENT DOCUMENTS 6,860,612 B2   3/2005 Chiang et al.
8,383,971 B2   2/2013 Liu
(Continued)

FOREIGN PATENT DOCUMENTS

CN   101577260 A   11/2009
CN   201440242 U    4/2010
(Continued)

OTHER PUBLICATIONS

Office action of related application by Taiwan IP Office on Dec. 26, 2018.
(Continued)

*Primary Examiner* — Ahmed M Saeed

(57) ABSTRACT

A light source board includes a substrate; a metal reactive layer disposed on the substrate; a metal conductive layer disposed on the metal reactive layer; a metal alloy layer disposed on the metal conductive layer; and at least one light source disposed on the metal alloy layer. A material of the metal reactive layer is a Sn—Bi type alloy or a Sn—Ag—Cu type alloy, and arrangements of materials of the metal reactive layer and the metal conductive layer are respectively an arrangement of silver paste and copper, an arrangement of silver paste and nickel, an arrangement of silver paste and silver, an arrangement of copper paste and copper, an arrangement of copper paste and nickel, or an arrangement of copper paste and silver.

21 Claims, 17 Drawing Sheets

(51) Int. Cl.
  *H05K 1/02* (2006.01)
  *H05K 1/18* (2006.01)
  *H05K 1/03* (2006.01)

(52) U.S. Cl.
  CPC ....... *H05K 1/189* (2013.01); *H01H 2219/036* (2013.01)

(58) Field of Classification Search
  CPC ...... H01H 1/02; H01H 1/0233; H01H 11/041; H01H 1/021; H01H 1/0231; H01H 1/02372; H01H 1/025; H01L 2924/0105; H01L 2924/0132; H01L 2924/0133; H01L 2924/01029; H01L 2924/01047; H01L 2924/0103; H01L 2924/01079; H01L 2924/01028; H01L 2224/73265; H01L 2224/48227; H01L 2924/014
  See application file for complete search history.

(56) References Cited

U.S. PATENT DOCUMENTS

| | | | | |
|---|---|---|---|---|
| 8,742,432 | B2* | 6/2014 | Sato | H01L 33/641 257/82 |
| 2010/0038226 | A1 | 2/2010 | Lin | |
| 2011/0042124 | A1* | 2/2011 | Matsui | H05K 3/4632 174/157 |
| 2011/0309379 | A1* | 12/2011 | Shibusawa | F21S 8/04 257/88 |

FOREIGN PATENT DOCUMENTS

| | | |
|---|---|---|
| CN | 102625578 A | 8/2012 |
| CN | 105470378 A | 4/2016 |
| TW | M478318 U | 5/2014 |
| TW | M546017 U | 7/2017 |
| TW | M547130 U | 8/2017 |

OTHER PUBLICATIONS

Office action of counterpart application by SIPO on Mar. 16, 2020.

* cited by examiner

US 10,895,372 B2

LIGHT SOURCE BOARD, MANUFACTURING METHOD THEREOF, AND LUMINOUS KEYBOARD USING THE SAME

This application is a continuation-in-part application of U.S. application Ser. No. 16/208,645, filed Dec. 4, 2018, which claims the benefit of Taiwan application Serial No. 107118699 filed on May 31, 2018, the disclosure of which is incorporated by reference herein in its entirety.

TECHNICAL FIELD

The disclosure relates to a circuit board, a manufacturing method thereof, and a keyboard using the same. More particularly, the disclosure relates to a light source board, a manufacturing method thereof, and a luminous keyboard using the same.

BACKGROUND

As to the tools of life around, besides the improvement of their basic functions, people often pursue other values added, such as beauty, comfort in use, and the like. For example, as to keyboards, besides the basic typing application, since people sometimes use the computer systems in environments lacking sufficient light, luminous keyboards are produced. Corresponding to the luminous function added to the keyboards, requirements of further improvements on light uniformity, increase of illumination diversity, thinning of the keyboards, and the like are generated.

SUMMARY

The disclosure relates to a light source board, a manufacturing method thereof, and a luminous keyboard using the same. The luminous keyboard using such a light source board is able to further improve user experience.

According to some embodiments, a light source board includes a substrate; a metal reactive layer disposed on the substrate; a metal conductive layer disposed on the metal reactive layer; a metal alloy layer disposed on the metal conductive layer; and at least one light source disposed on the metal alloy layer. A material of the metal reactive layer is a Sn—Bi type alloy or a Sn—Ag—Cu type alloy, and arrangements of materials of the metal reactive layer and the metal conductive layer are respectively an arrangement of silver paste and copper, an arrangement of silver paste and nickel, an arrangement of silver paste and silver, an arrangement of copper paste and copper, an arrangement of copper paste and nickel, or an arrangement of copper paste and silver.

According to some embodiments, a light source board includes a substrate; a metal reactive layer disposed on the substrate; a metal conductive layer disposed on the metal reactive layer; a first metal protective layer disposed on the metal conductive layer; a metal alloy layer disposed on the first metal protective layer; and at least one light source disposed on the metal alloy layer, wherein a material of the metal reactive layer is a Sn—Bi type alloy or a Sn—Ag—Cu type alloy, and arrangements of materials of the metal reactive layer, the metal conductive layer and the first metal protective layer are respectively an arrangement of silver paste, copper and gold, an arrangement of silver paste, nickel and gold, an arrangement of silver paste, silver and gold, an arrangement of silver paste, copper and nickel, an arrangement of silver paste, silver and nickel, an arrangement of copper paste, copper and gold, or an arrangement of copper paste, nickel and gold, an arrangement of copper paste, silver and gold, and arrangement of copper paste, copper and nickel, an arrangement of copper paste, silver and nickel.

According to some embodiments, a light source board includes a substrate; a metal reactive layer disposed on the substrate; a metal conductive layer disposed on the metal reactive layer; a first metal protective layer disposed on the metal conductive layer; a second metal protective layer disposed on the first metal protective layer; a metal alloy layer disposed on the second metal protective layer; and at least one light source disposed on the metal alloy layer, wherein a material of the metal reactive layer is a Sn—Bi type alloy or a Sn—Ag—Cu type alloy, and arrangements of materials of the metal reactive layer, the metal conductive layer, the first metal protective layer and the second metal protective layer are respectively an arrangement of silver paste, silver, nickel and gold, an arrangement of silver paste, copper, nickel and gold, an arrangement of copper paste, silver, nickel and gold, or an arrangement of copper paste, copper, nickel and gold.

metal reactive layermetal conductive layermetal conductive layermetal reactive layermetal conductive layermetal reactive layermetal reactive layermetal reactive layermetal conductive layermetal reactive layermetal conductive layermetal reactive layermetal conductive layermetal reactive layermetal reactive layermetal reactive layermetal reactive layermetal conductive layermetal reactive layermetal reactive layermetal conductive layermetal conductive layermetal conductive layermetal reactive layermetal conductive layermetal reactive layermetal reactive layermetal reactive layermetal conductive layermetal reactive layer

Figure 1A:
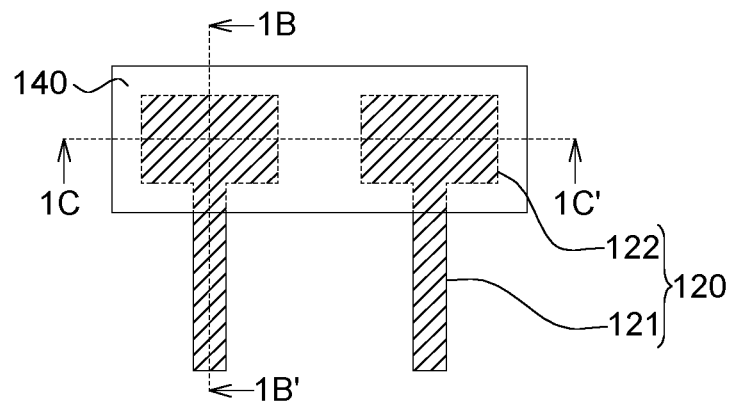
FIGS. 1A-1D show a light source board and a composite circuit layer therein according to some embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The embodiments and the accompanying drawings provided for illustrative and explaining purposes, but not for a limiting purpose. It is understood that, as to the structure, further elements may be added, some elements may be removed, some elements may be combined together, and/or any other acceptable modification may be made. Besides, when an element is illustrated in a singular form, the cases that a plurality of the elements are existed may also be possible. As to the method, the sequence of steps may be modified, further steps may be added, some steps may be omitted, some steps may be combined, and/or any other acceptable modification may be made. For clarity, the components in the figures may not be drawn to scale. Besides, some components and/or reference numerals may be omitted from some drawings. It is contemplated that the elements and features of one embodiment can be beneficially incorporated into another embodiment without further recitation, as long as it is acceptable.

Figure 1B:
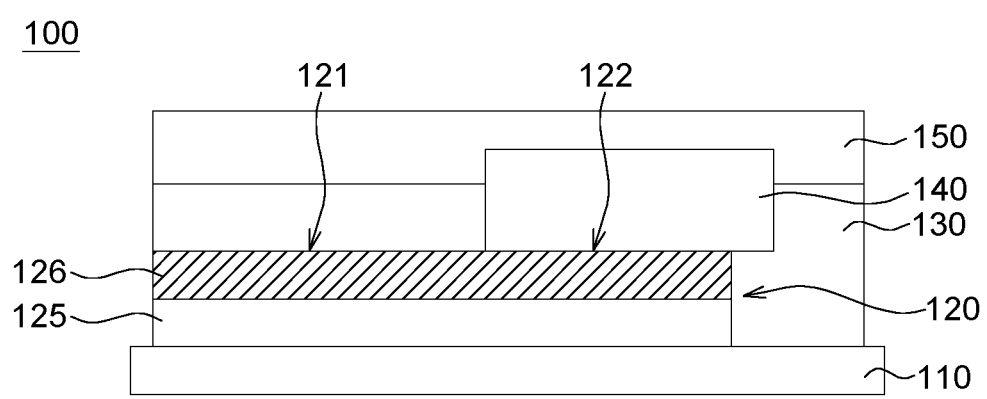
Figure 1C:
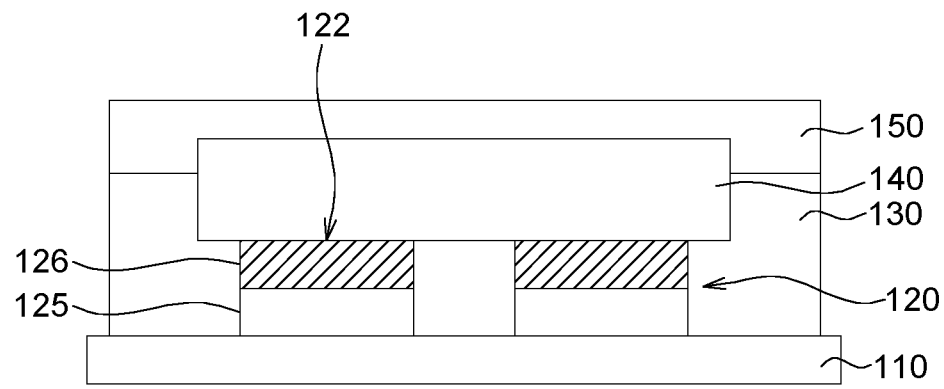

Now refer to FIGS. 1A-1D for a more clear understanding of the light source board as described above. In FIGS. 1A-1D, a light source board 100 and a composite circuit layer 120 therein are shown. FIG. 1A illustrates the composite circuit layer 120 of the light source board 100 in a top view, but omit most of the components in the light source board 100 for clarity. FIG. 1B and FIG. 1C are cross-sectional views of the light source board 100 along the line 1B-1B' and the line 1C-1C' in FIG. 1A, respectively. As shown in FIG. 1B and FIG. 1C, the light source board 100 comprises a substrate 110, the composite circuit layer 120, a first protective layer 130, and a plurality of light sources 140, wherein the light sources 140 has two electrode contacts, i.e., positive and negative electrode contacts, on its bottom, and the two electrode contacts are electrically connect to two composite circuit layers 120, respectively, so as to construct a loop to receive power from a power source.

As to the substrate 110, any suitable substrate may be used. According to some embodiments, a substrate that can be provided for a printing process is used. In some embodiments, a flexible substrate is used. For example, the substrate 110 may be made of PET.

Figure 1D:
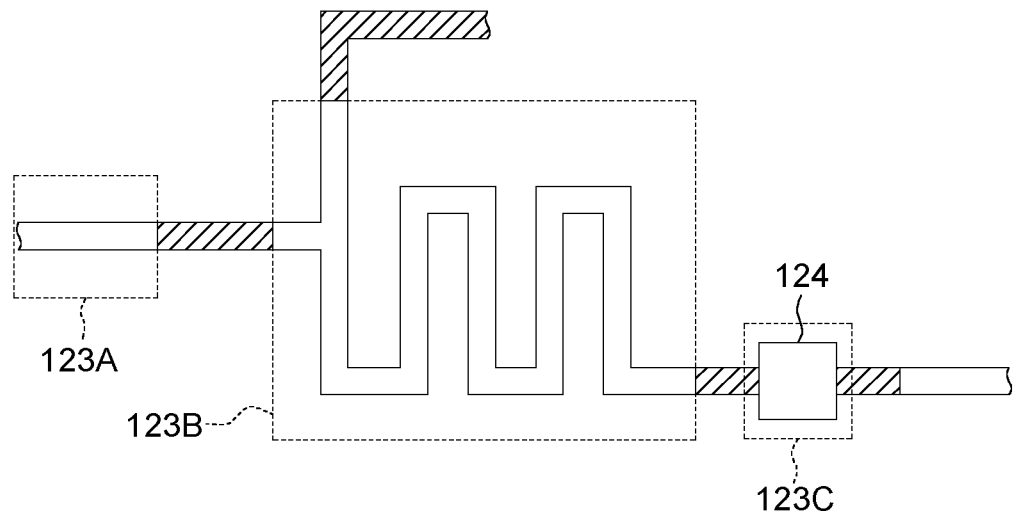

The composite circuit layer 120 is disposed on the substrate 110. As shown in FIG. 1A, the composite circuit layer 120 has a wire portion 121 and pad portions 122. A width of the pad portions 122 can be modified depending on the size of the light sources 140. When a light source 140 has a larger size, the width of the pad portions 122 may be larger than the width of the wire portion 121 to increase the soldering area between the larger-sized light source 140 and the pad portions 122. When a light source 140 has a smaller size, the width of the pad portions 122 may be smaller than the width of the wire portion 121 while be enough to fix the smaller-sized light source 140. The wire portion 121 is electrically coupled to the pad portions 122. For example, as shown in FIG. 1A, the wire portion 121 may be electrically coupled to the pad portions 122 through a physical connection. FIG. 1B and FIG. 1C show a metal reactive layer 125 and a metal conductive layer 126 of the composite circuit layer 120, the metal conductive layer 126 is stacked on the metal reactive layer 125, and they are used to form the composite circuit layer 120. A conductivity of the metal conductive layer 126 is higher than a conductivity of the metal reactive layer 125. In some embodiments, a material of the metal reactive layer 125 may comprise silver paste, copper paste or other suitable material, and a material of the metal conductive layer 126 may comprise copper, nickel, silver or other suitable material. The metal reactive layer 125 can be used to guide the ink which is effectively deposited on the surface of the circuit, and can effectively enhance the electrochemical deposition reactivity. The metal conductive layer 126 is a pure metal conductive layer with high hardness and high electrical conductivity. In the light source board 100, the wire portion 121 is formed of at least the metal reactive layer 125, and may locally or entirely further comprise the metal conductive layer 126 depending on the requirement of the magnitude of resistance. When a lower resistance per unit length is required for the wire portion 121, the wire portion 121 may be formed of the metal reactive layer 125 and the metal conductive layer 126 together. When a higher resistance per unit length is required for the wire portion 121, the wire portion 121 may include only the metal reactive layer 125 without a metal conductive layer 126 covering thereon. In some embodiments, for decreasing the current flowing through the composite circuit layer 120, the composite circuit layer 120 may further comprise a resistance increasing portion 123. For example, the resistance increasing portion may be, but not limited to, any one or any combination of the resistance increasing portions 123A-123C shown in FIG. 1D. Referring to FIG. 1D, (1) the resistance increasing portion 123A have only the metal reactive layer 125 without the metal conductive layer 126, (2) the resistance increasing portion 123B have only the metal reactive layer 125 with an increased length or a reduced width of the metal reactive layer 125 in the resistance increasing portion 123B by forming a S-shaped extension intentionally, (3) the resistance increasing portion 123C is a portion in which the composite circuit layer 120 is cut with a resistance device 124 disposed in series between the two ends of the cut portion.

Referring back to FIG. 1B and FIG. 1C, the first protective layer 13 is disposed on the composite circuit layer 120, and exposes the pad portions 122. The first protective layer 130 may be formed of PET, UV paste, or the like.

Figure 2A:
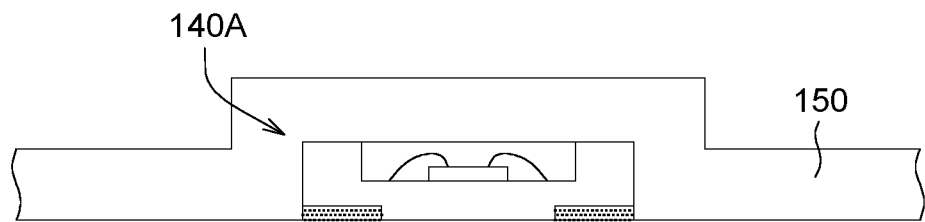
FIGS. 2A-2C show LED light sources having packaging structures according to various embodiments.
Figure 2B:
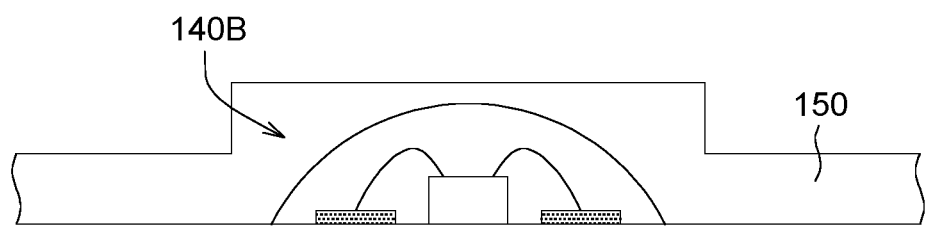
Figure 2C:
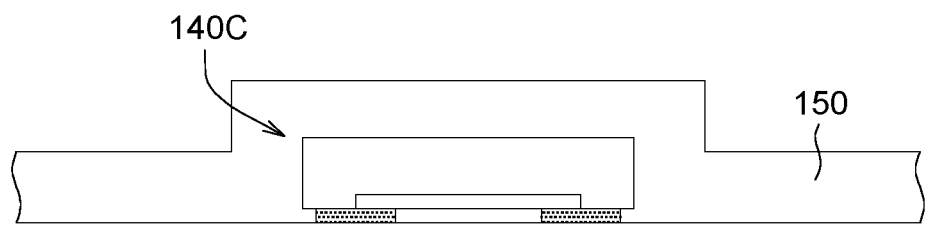
Figure 3A:
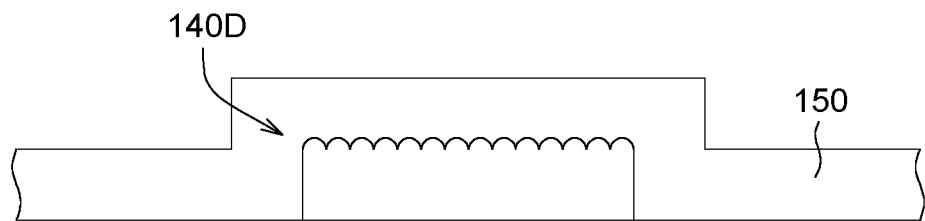
FIGS. 3A-3C show LED light sources having encapsulating layers according to various embodiments.
Figure 3B:
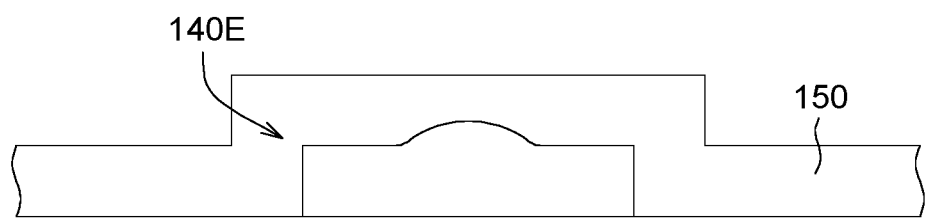
Figure 3C:
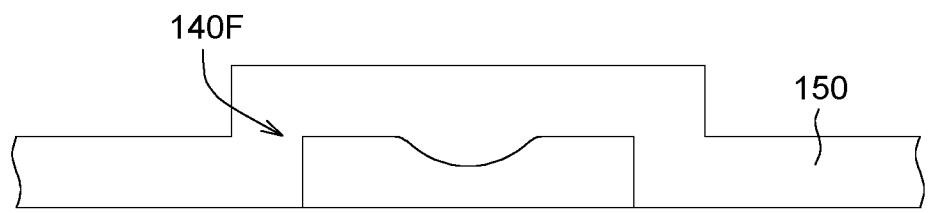

The light sources 140 are disposed on the pad portions 122, respectively. The light sources 140 may be LED light sources. For example, a LED light source 140A having a plastic leaded chip carrier (PLCC) packaging structure as shown in FIG. 2A may be used. A LED light source 140B having a wire bonding packaging structure as shown in FIG. 2B may be used. Alternatively, a LED light source 140C having a chip scale package (CSP) structure as shown in FIG. 2C may be used. In some embodiments, the configuration of the encapsulating layer in a packaging structure may be varied to achieve a particular optical effect. For example, a LED light source in which the encapsulating layer has a light homogenizing structure, such as a LED light source 140D as shown in FIG. 3A, may be used, wherein in LED light source 140D, a diffusing microstructure, such as a micro lens, is formed on the surface of the encapsulating layer. A LED light source in which the encapsulating layer has a light concentrating structure, such as a LED light source 140E as shown in FIG. 3B, may be used, wherein in LED light source 140E, the surface of the encapsulating layer is formed to have a single spherical convex structure to achieve a light concentrating effect. Alternatively, a LED light source in which the encapsulating layer has a light diverging structure, such as a LED light source 140F as shown in FIG. 3C, may be used, wherein in LED light source 140F, the surface of the encapsulating layer is formed to have a single spherical concave structure to achieve a light diverging effect.

It is understood that, while the embodiments relate to a light source boards and thereby focused on the cases of the light sources, other electronic components may be disposed on the pad portions in a similar manner. That is, in some embodiments, there may be some pad portions are provided for the electrical couple of the electronic components other than the light sources.

Figure 4A:
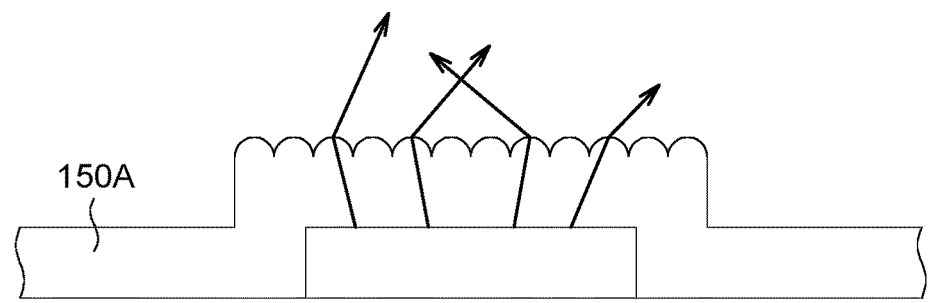
FIGS. 4A-4D show second protective layers of light source boards according to various embodiments.
Figure 4B:
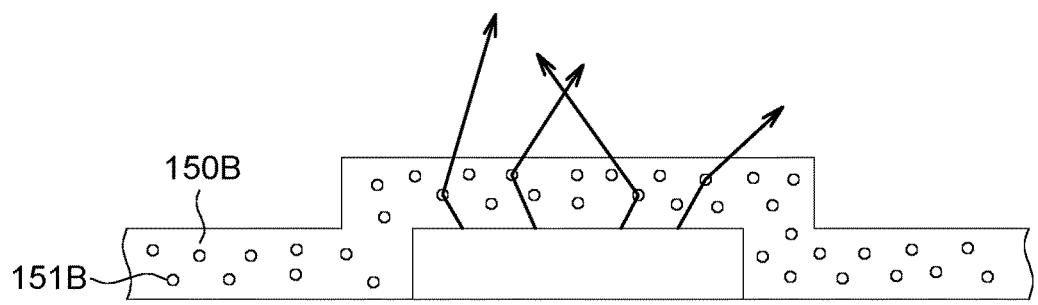
Figure 4C:
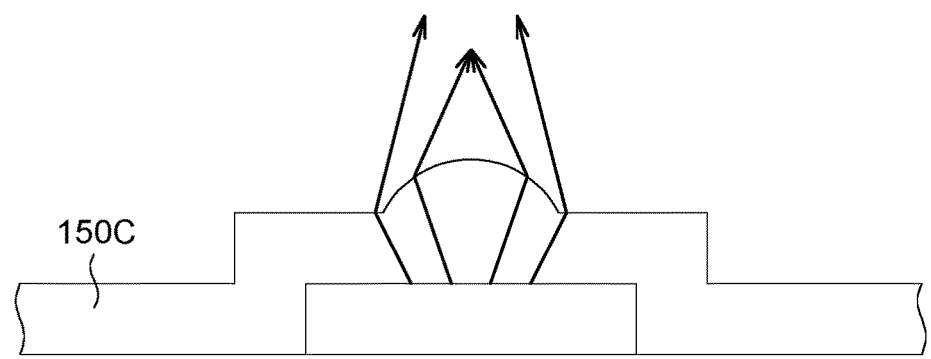
Figure 4D:
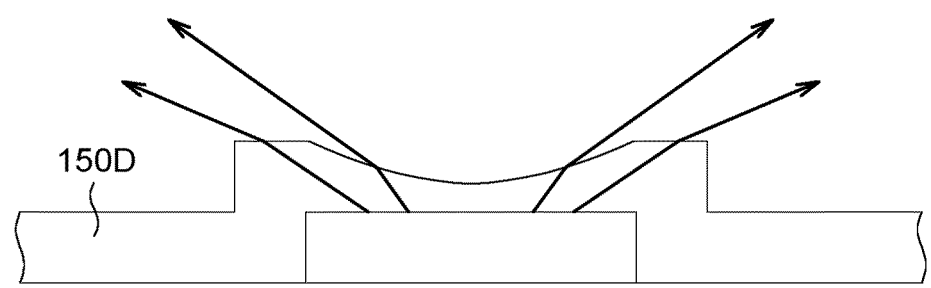

In some embodiments, as shown in FIG. 1B and FIG. 1C, the light source board 100 may further have a second protective layer 150. The second protective layer 150 is disposed on the first protective layer 130 and the light sources 140. According to some embodiments, the second protective layer 150 may further have a light homogenizing structure and/or a light concentrating or diverging structure. For example, as shown in FIG. 4A, a diffusing microstructure, such as a micro lens, may be formed on the surface of the second protective layer 150A to achieve a light homogenizing effect. Alternatively, as shown in FIG. 4B, diffusing particles 151B may be added into the second protective layer 150B to achieve a light homogenizing effect. The diffusing particles 151B may be titanium dioxide, silicon dioxide, phosphor, or the like. Besides, as shown in FIG. 4C, the surface of the second protective layer 150C may be formed to have a single spherical convex structure to achieve a light concentrating effect. Alternatively, as shown in FIG. 4D, the surface of the second protective layer 150D may be formed to have a single spherical concave structure to achieve a light diverging effect. The second protective layer 150 may be formed of PET, UV paste, or the like. The material of the second protective layer 150 may be the same as or different from the material of the first protective layer 130.

Figure 5:
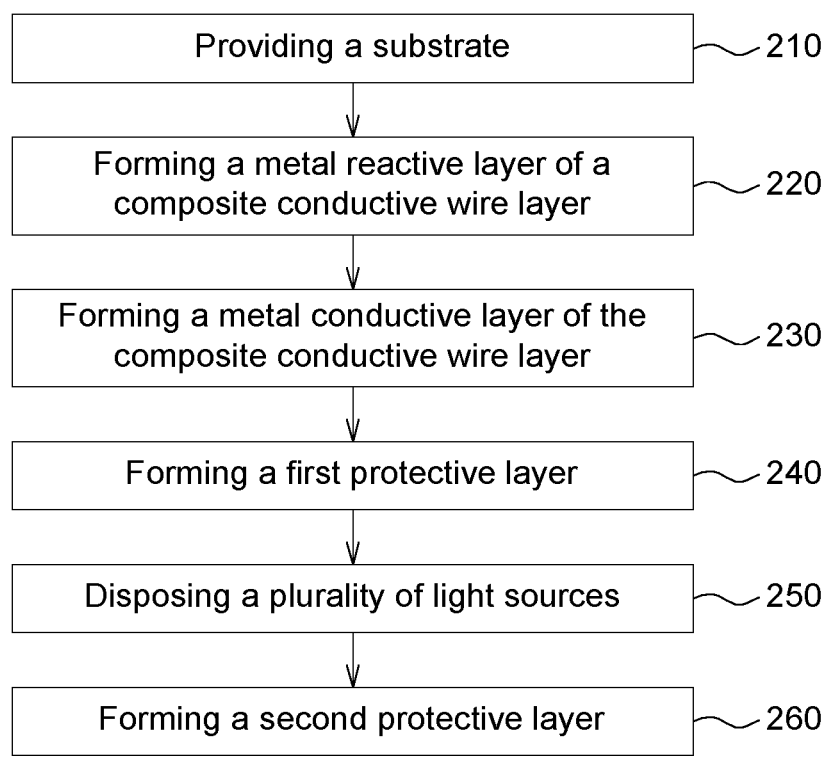
FIG. 5 is a flow diagram of a manufacturing method of a light source board as shown in FIGS. 1A-1D.

Referring to FIG. 5, a flow diagram of a manufacturing method of the light source board 100 is shown. In a step 210, a substrate 110 is provided. The substrate 110 may have a long side, a first short side, and a second short side. In a step 220, a metal reactive layer 125 of a composite circuit layer 120 is formed on the substrate 110. In a step 230, a metal conductive layer 126 is formed on the metal reactive layer 125, wherein a conductivity of the metal conductive layer 126 is higher than a conductivity of the metal reactive layer 125. In some embodiments, forming the metal reactive layer 125 comprises conducting a printing process, and forming the metal conductive layer 126 comprises conducting a plating process. For example, the printing process for forming the metal reactive layer 125 may comprise coating a conductive paste being at least one of copper paste, nickel past, and silver paste. The plating process for forming the metal conductive layer 126 may comprise chemical plating or electroplating a metal being at least one of silver, tin, nickel, and gold. For example, in some embodiments, the metal reactive layer 125 may be formed by screen printing silver paste, and the metal conductive layer 126 may be formed by chemical plating copper. The wire portion 121 of the composite circuit layer 120 is formed of at least the metal reactive layer 125, and may further comprise the metal conductive layer 126. The pad portions 122 are formed of at least the metal reactive layer 125 and the metal conductive layer 126. Thereafter, in a step 240, a first protective layer 130 is formed on the composite circuit layer 120. The first protective layer 130 exposes the pad portions 122. Since forming the first protective layer 130 is conducted after forming the metal conductive layer 126, the first protective layer 130 covers portions of the metal conductive layer 126 outside the pad portions 122, for example, the first protective layer 130 covers the wire portion 121. In a step 250, a plurality of light sources 140 are disposed on the pad portions 122. Optionally, a step 260 may be conducted. In the step 260, a second protective layer 150 is formed on the first protective layer 130 and the light sources 140. The second protective layer 150 may have a light homogenizing structure and/or a light concentrating or diverging structure.

Figure 6A:
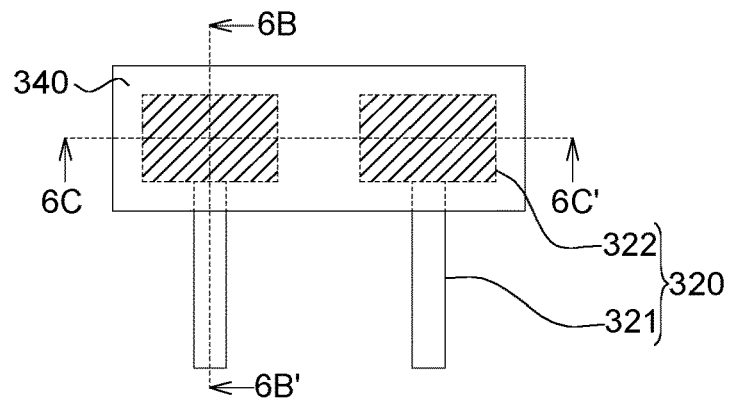
FIGS. 6A-6C show a light source board and a composite circuit layer therein according to some other embodiments.
Figure 6B:
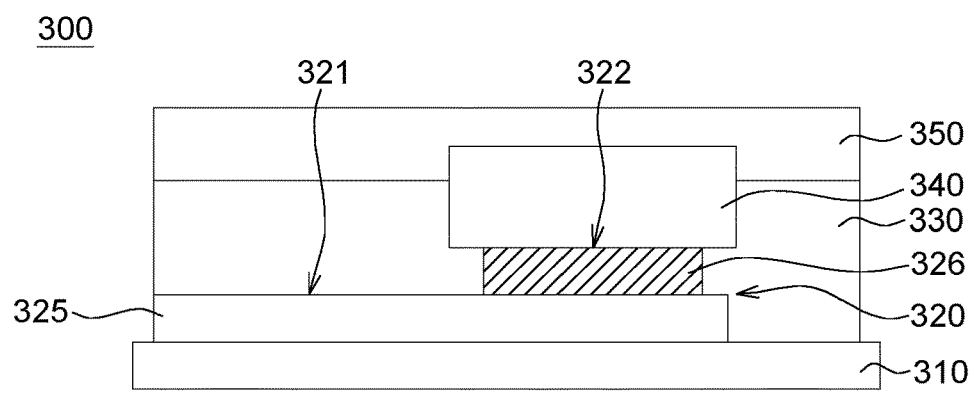
Figure 6C:
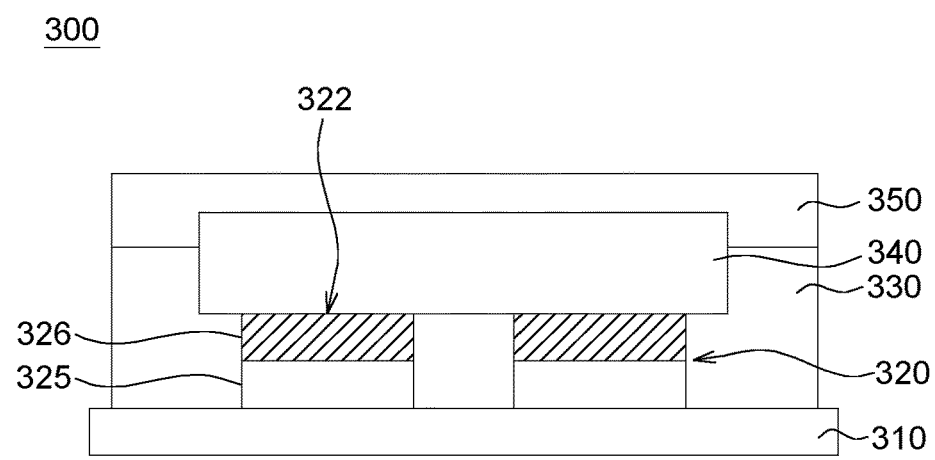

Now referring to FIGS. 6A-6C, another light source board 300 and a composite circuit layer 320 therein are shown. FIG. 6A illustrates the composite circuit layer 320 of the light source board 300 in a top view, but omit most of the components in the light source board 300 for clarity. FIG. 6B and FIG. 6C are cross-sectional views of the light source board 300 along the line 6B-6B' and the line 6C-6C' in FIG. 6A, respectively. The light source board 300 comprises a substrate 310, the composite circuit layer 320, a first protective layer 330, and a plurality of light sources 340, and may comprise a second protective layer 350 optionally, wherein the substrate 310, the first protective layer 330, the light sources 340, and the second protective layer 350 are similar to the corresponding components of the light source board 100 as described above, for brevity, further description thereof is omitted herein, and the attention is focused on only the composite circuit layer 320 with different configuration.

As shown in FIGS. 6A-6C, in the light source board 300, the metal conductive layer 326 of the composite circuit layer 320 is disposed on only the pad portions 322. The wire portion 321 does not comprise the metal conductive layer 326 having a lower resistivity/a higher conductivity. For example, the wire portion 321 may be formed of only the metal reactive layer 325. However, the cases that another layer having a conductivity similar to or lower than the metal reactive layer 325 is disposed in the wire portion 321 are not excluded. Similar to the composite circuit layer 120, a material of the metal reactive layer 325 may comprise copper paste or silver paste, and a material of the metal conductive layer 326 may comprise copper (Cu), nickel (Ni) or silver (Ag). Besides, the composite circuit layer 320 may also comprise a resistance increasing portion, such as one similar to the resistance increasing portion 123B shown in FIG. 1D in which a length of the metal reactive layer 325 is increased and/or a width of the metal reactive layer 325 is reduced, or such as one similar to the resistance increasing portion 123C shown in FIG. 1D in which the composite circuit layer 320 is cut with a resistance device disposed in series between the two ends of the cut portion.

Figure 7:
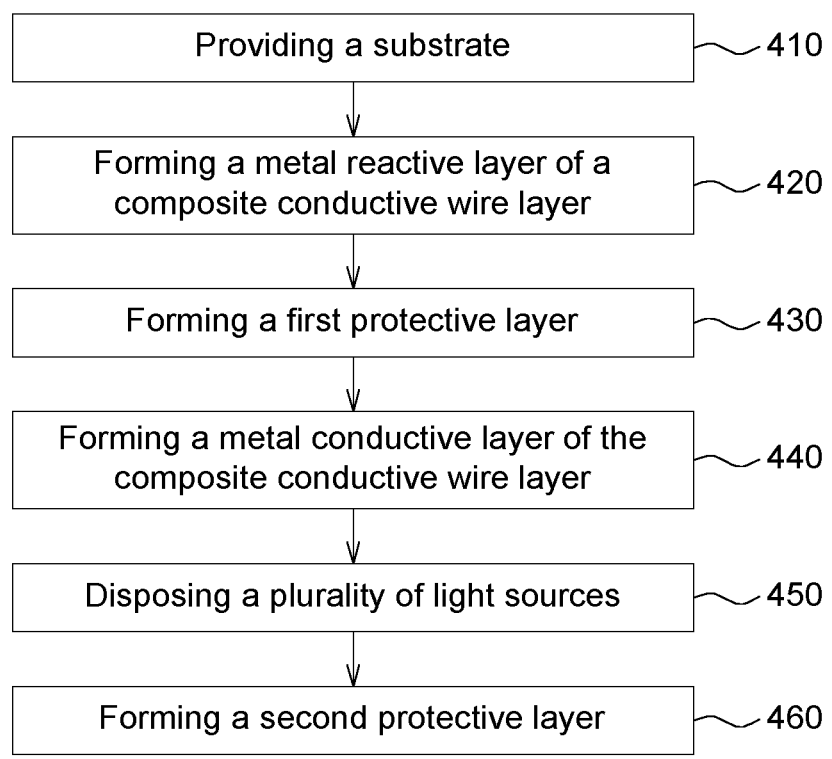
FIG. 7 is a flow diagram of a manufacturing method of a light source board as shown in FIGS. 6A-6C.

Referring to FIG. 7, a flow diagram of a manufacturing method of the light source board 300 is shown. For brevity, some details similar to those described with respect to FIG. 5 may be omitted herein. In a step 410, a substrate 310 is provided. In a step 420, a metal reactive layer 325 of a composite circuit layer 320 is formed on the substrate 310. Then, in a step 430, a first protective layer 330 is formed in advance. The first protective layer 330 exposes pad portions 322. Thereafter, in a step 440, a metal conductive layer 326 of the composite circuit layer 320 is formed using the first protective layer 330 as a mask, and the metal conductive layer 326 are formed in only the pad portions 322. In a step 450, a plurality of light sources 340 are disposed on the pad portions 322. Optionally, a step 460 may be conducted. In the step 460, a second protective layer 350 is formed on the first protective layer 330 and the light sources 340.

The embodiments of the light source board and the manufacturing method thereof of this disclosure have been provided in the previous paragraphs. In still another aspect of the disclosure, a luminous keyboard using the light source board as described above is provided. The luminous keyboard comprises a plurality of keycaps and a light source board. The light source board is disposed under the keycaps. The light source board may be a light source board according to any embodiment described above. Light emitted by the light sources is able to travel upward to the keycaps.

Figure 8A:
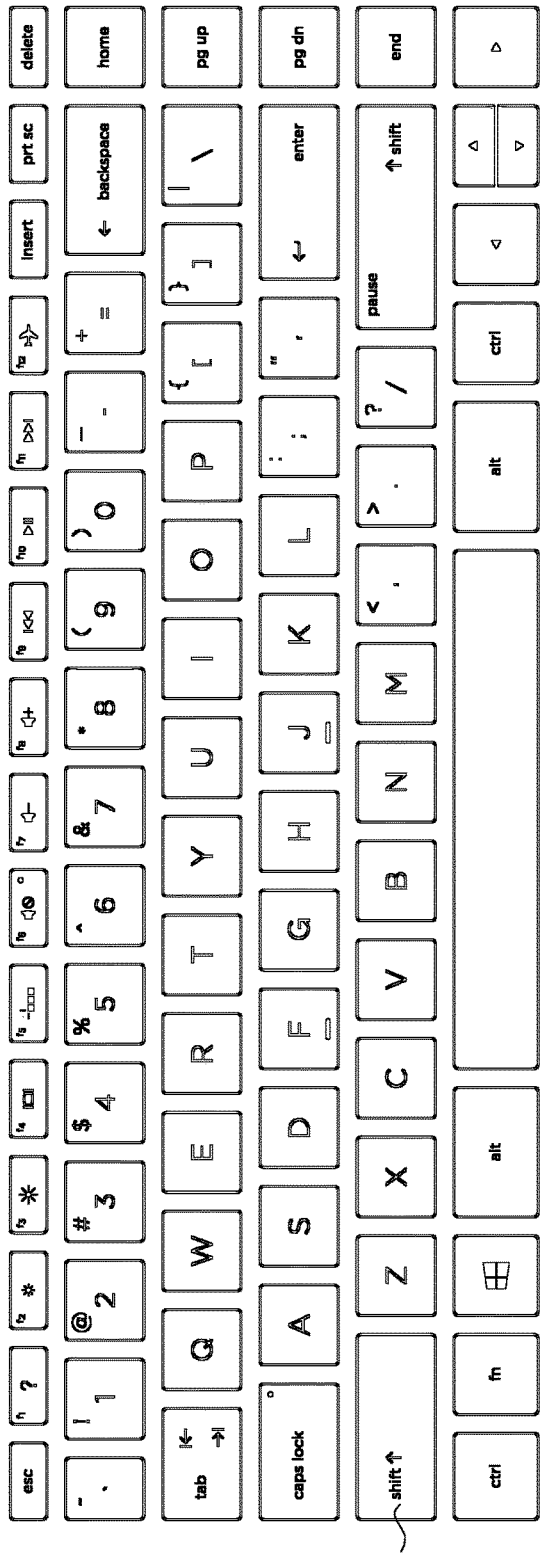
FIGS. 8A-8D show various layers of a luminous keyboard according to some embodiments.
Figure 8B:
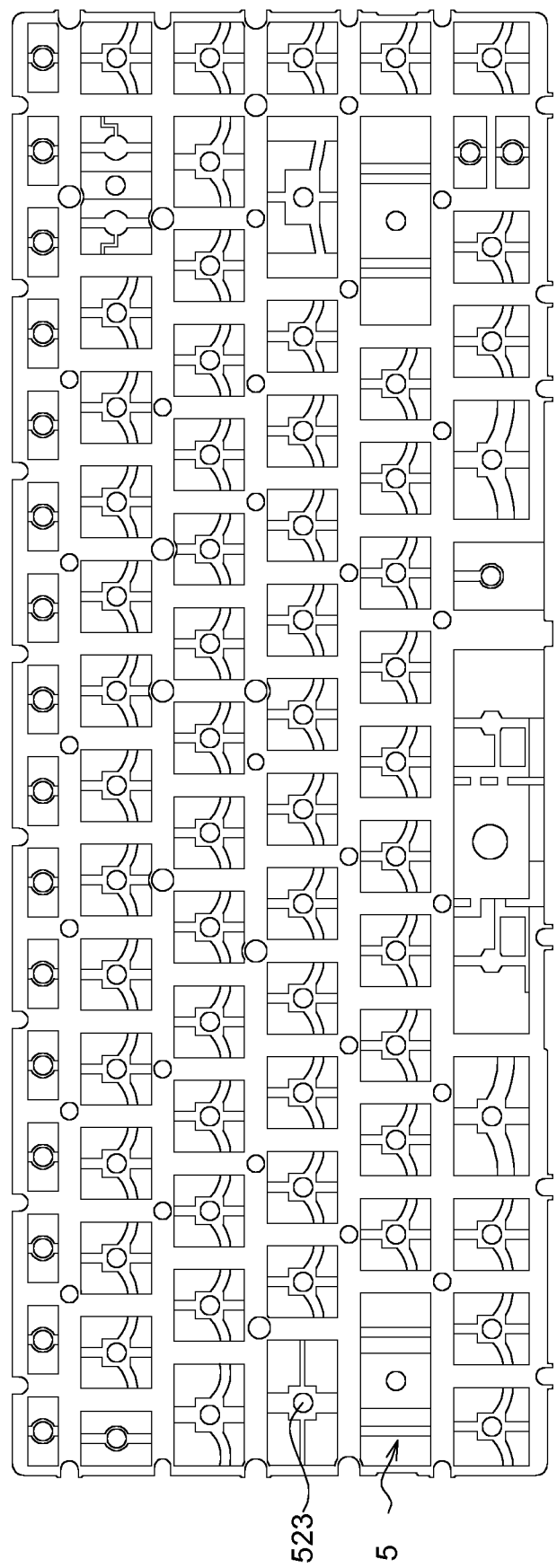
Figure 8C:
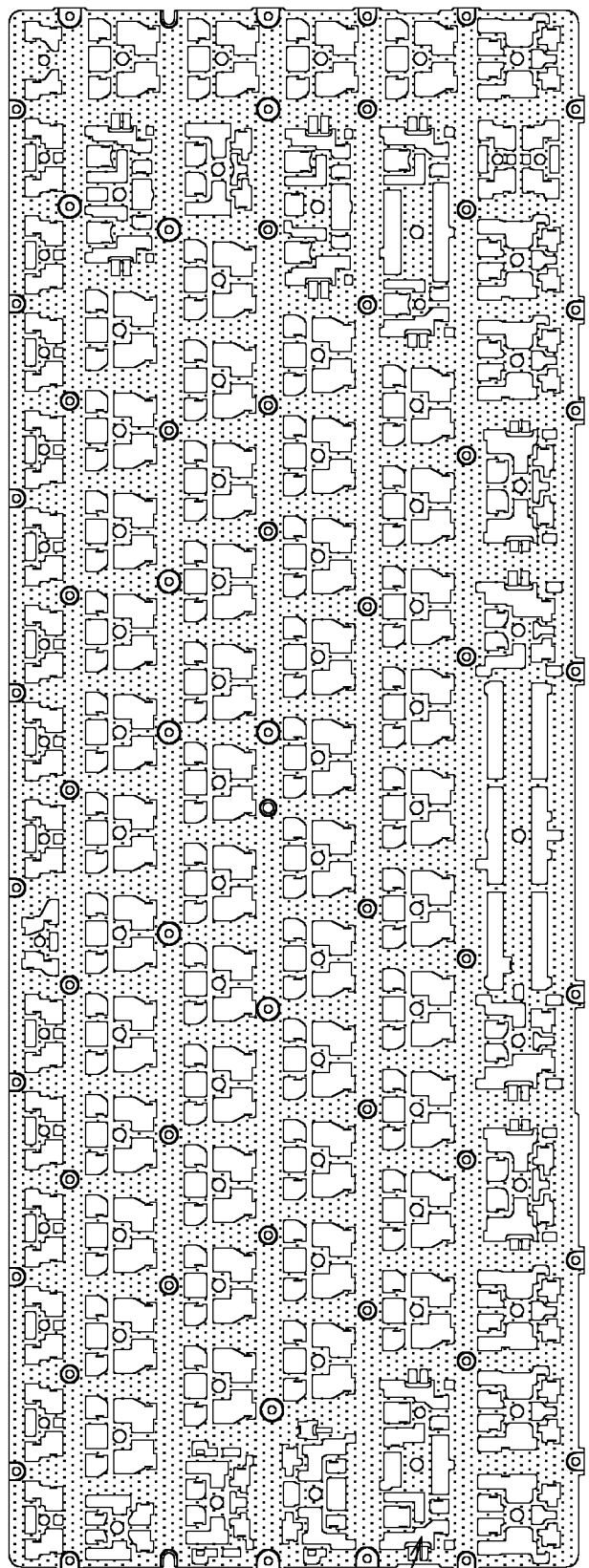
Figure 8D:
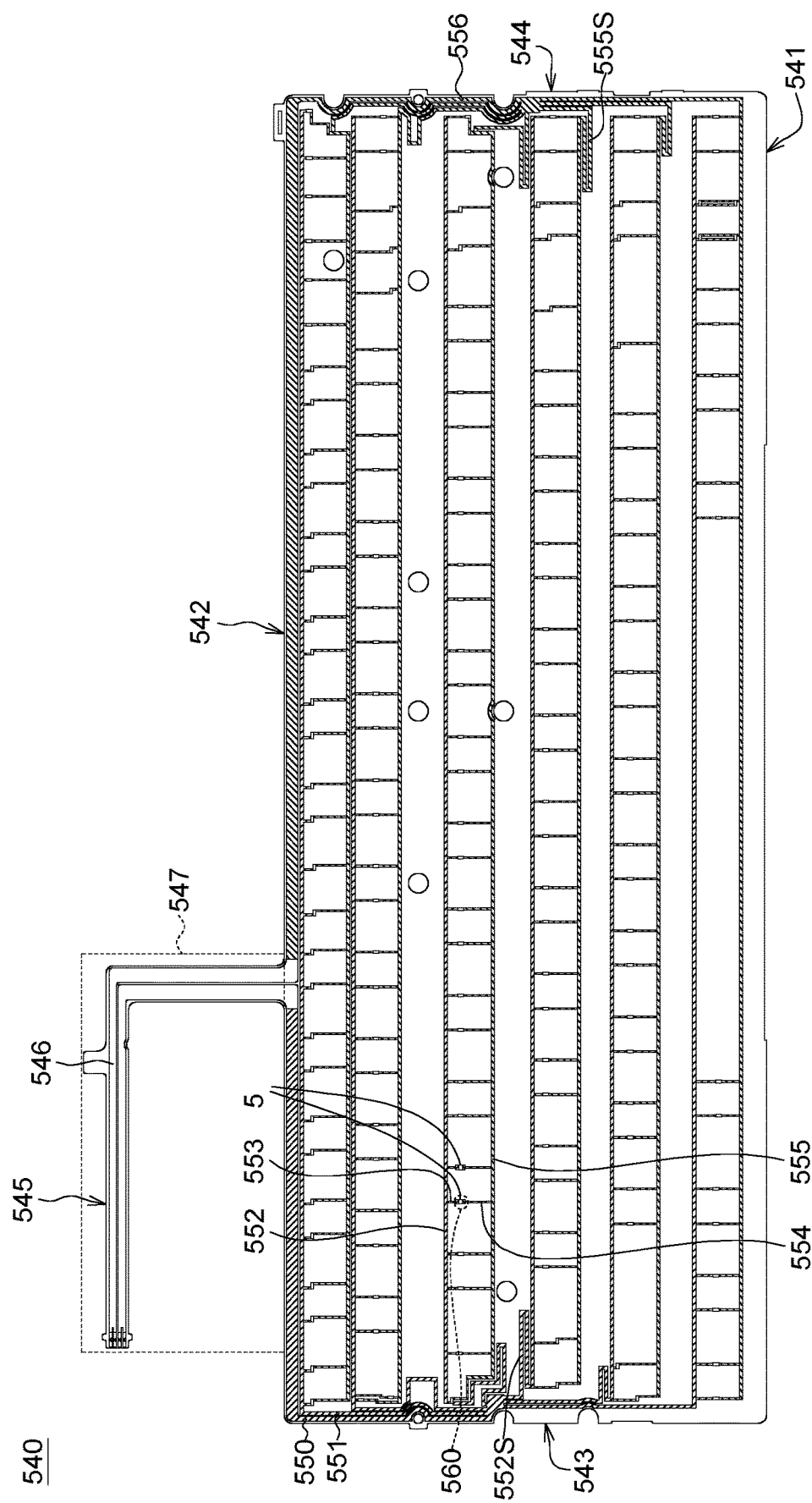
Figure 9:
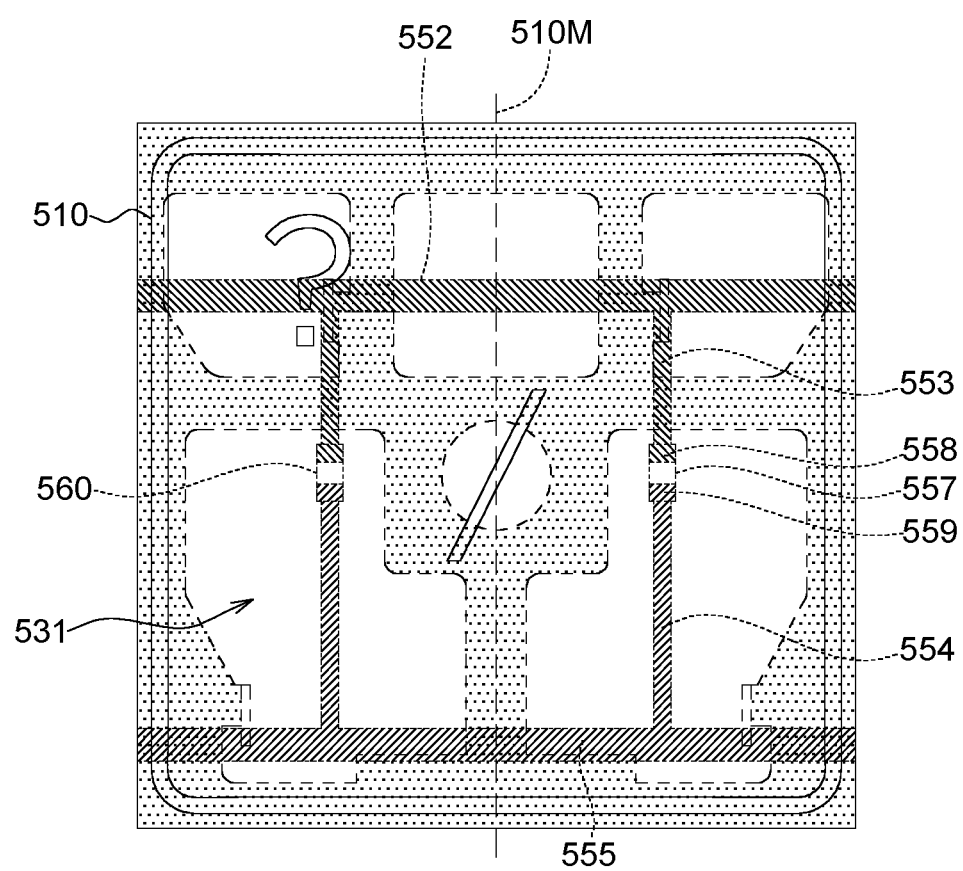
FIG. 9 shows a top view of one key of a luminous keyboard as shown in FIGS. 8A-8D.
Figure 10:
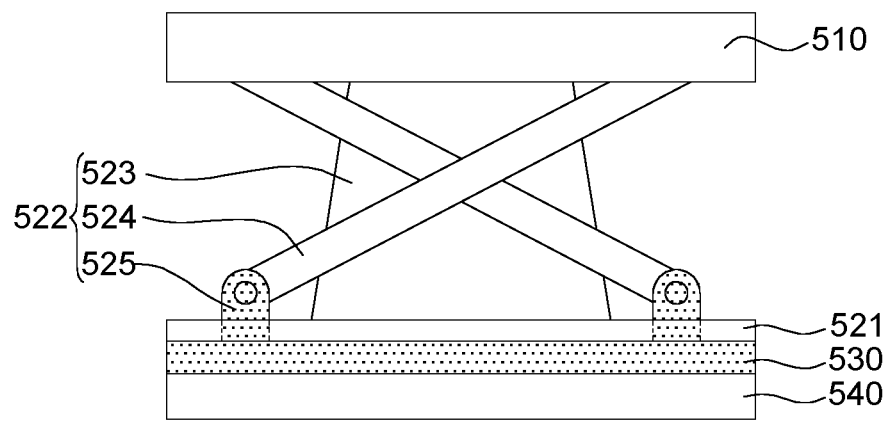
FIG. 10 shows a side view of one key of a luminous keyboard as shown in FIGS. 8A-8D.

Now refer to FIGS. 8A-8D, FIG. 9, and FIG. 10 for a more clear understanding of the luminous keyboard as described above. FIGS. 8A-8D show layers of a luminous keyboard from top to bottom, respectively, according to some embodiments. FIG. 9 and FIG. 10 show a top view and a side view of one key of the luminous keyboard, respectively.

Referring to FIG. 8A, a plurality of keycaps 510 of the luminous keyboard are shown. It is understood that the keycaps 510 may be arranged in any suitable manner and/or have any suitable combination of characters, and are not limited to the case shown in the figure. The characters of the keycaps 510 of the luminous keyboard, such as "?" and "/" shown in FIG. 9, may be light transmissive. In some embodiments, the characters in different positions may have different colors, such as by using transparent paint of different colors, so as to increase the diversity of light emission and the convenience of use.

Referring to FIG. 8B, an optional membrane switch layer 520 of the luminous keyboard is shown. The membrane switch layer 520 is disposed under the keycaps 510. According to some embodiments, the membrane switch layer 520 may comprise a switch electrode layer 521 and a plurality of supporting structures 522 as shown in FIG. 10. The switch electrode layer 521 comprises a plurality of switch electrodes (not shown, under the rubber dome 523), and, when one of the keycaps 510 is pressed, corresponding one of the switch electrodes is able to be triggered and turned on. The supporting structures 522 are disposed on the switch electrode layer 521, each couple the corresponding keycap 510 to a base plate 530, and the supporting structures 522 are able to support the up and down movement of the keycaps 510. When a keycaps 510 is pressed by an external force, the keycaps 510 moves downward, and contacts and turns on a switch electrode. When the external force disappears, the keycap 510 is able to be pushed upward by a restoring force source, such as a rubber dome, a magnet pair with repulsive polarity, or a metal spring/shrapnel, such that it does not contact and turn on a switch electrode anymore. For example, as shown in FIG. 10, each of the supporting structures 522 may comprises rubber dome 523, a scissor structure 524, and a connecting structure 525, which are commonly used in keyboards. When a keycap 510 is pressed, the rubber dome 523 is flatten such that a protrusion on the bottom of the rubber dome 523 thereby contacts, triggers, and turns on the switch electrode thereunder. The scissor structure 524 is able to assist the support of the keycap 510, and thereby the feedback force can be more uniform and the user's feeling is improved. The connecting structure 525 is used to couple the scissor structure 524 to the base plate 530 below. However, any suitable structure may be used, and the embodiments are not limited to those described above. The membrane switch layer 520 may have a plurality of openings 526, and each of the keycaps 510 corresponds to at least one of the openings 526.

Referring to FIG. 8C, an optional base plate 530 of the luminous keyboard is shown. The base plate 530 is disposed under the keycaps 510. The base plate 530 has a plurality of openings 531, and each of the keycaps 510 corresponds to at least one of the openings 531. The openings 531 may overlap at least partially with the openings 526, such that light emitted by a light source board 540 is able to travel upward unimpeded. As shown in the embodiment of FIG. 10, the switch electrode layer 521 may be disposed on the base plate 530, the light source board 540 (shown in FIG. 8D) may be disposed under the base plate 530, and they are separated from each other by the base plate 530. Besides, the connecting structure 525 may be a snap punched upwardly from the base plate 530 and integrated with the base plate 530, as shown in FIG. 10.

Referring to FIG. 8D, the light source board 540 of the luminous keyboard is shown. The light source board 540 may be a light source board according to any embodiment described above, such as the light source board 100 or the light source board 300. The openings 531 partially overlap with the openings 526, and light sources 560 on the light source board 540 is positioned under the overlapping portion of the openings 531 and the openings 526, such that light emitted by the light sources is able to travel upward unimpeded with low loss through the openings 531 (and the openings 526) to the keycaps 510. Under each of the keycaps 510, there may be one or more of the light sources 560.

A substrate 541 of the light source board 540 has a long side 542, a first short side 543, and a second short side 544. As shown in FIG. 8D, the light source board 540 may further have a wire tail portion 545. The wire tail portion 545 extends from the long side 542. The wire tail portion 545 has a plurality of extended wires 546 and a portion to be bent 547. The substrate 541 may be formed of a flexible material. At the area corresponding to the portion to be bent 547, the substrate 541 may be bent by an external force. The extended wires 546 may be seen as an extending portion of a composite circuit layer 550 at the wire tail portion 545. However, no matter the light source board 100 or the light source board 300 as described above is used as the light source board 540, the extended wires 546 are formed of only the metal reactive layer in the portion to be bent 547, and the metal conductive layer, of which the material itself has lower flexibility, unextends in the portion to be bent 547. Thereby, it is possible to prevent the metal conductive layer from being broken due to bending in the portion to be bent 547, which will lead to unstable current transfer quality of the extended wires 546.

As shown in FIG. 8D, the composite circuit layer 550 may comprise a plurality of first high potential wires 551, a plurality of second high potential wires 552, a plurality of first low potential wires 556, and a plurality of second low potential wires 555. Herein, the high potential wires and the low potential wires may be realized as wires of positive and negative poles. According to some embodiments, the first high potential wires 551 extend from the wire tail portion 545 to a middle area of the first short side 543. The second high potential wires 552 extend in a manner substantially parallel to the long side 542 from the middle area of the first short side 543 to proximity of pad portions 557. The second low potential wires 555 extend in a manner substantially parallel to the long side 542 from the proximity of the pad portions 557 to a middle area of the second short side 544. The first low potential wires 556 extend from the middle area of the second short side 544 to the wire tail portion 545. In some embodiments, as shown in FIG. 8D, the second high potential wires 552 have S-shaped detour portions 552S, respectively, in proximity of the middle area of the first short side 543, and the S-shaped detour portions 552S have different lengths whereby currents passing the second high potential wires 552 are adjusted to be substantially the same. In some embodiments, the second low potential wires 555 may have similar S-shaped detour portions 555S. According to some embodiments, as shown in FIG. 8D, (the composite circuit layer 550 of) the light source board 540 may further have a plurality of third high potential wires 553 and a plurality of third low potential wires 554. Also referring to FIG. 9, each of the pad portions 557 has a positive electrode 558 and a negative electrode 559. The third high potential wires 553 and the third low potential wires 554 extend in a manner substantially parallel to the first short side 543. Each of the third high potential wires 553 is electrically coupled to one of the second high potential wires 552 and to the positive electrode 558 of corresponding one of the pad portions 557, and each of the third low potential wires 554 is electrically coupled to one of the second low potential wires 555 and the negative electrode 559 of corresponding one of the pad portions 557. It is understood that the arrangement of the composite circuit layer 550 is not limited thereto, as long as the arrangement is acceptable for the light source board 540. For example, in the cases that the space of the light source board 540 can provide greater wiring flexibility, the second high potential wires 552 and the second low potential wires 555 need not extend substantially parallel to the long side 542.

Now referring to FIG. 9, in some embodiments, under each of the keycaps 510, there are at least two of the light sources 560. For providing electrical couple to each of the light sources 560, under each of the keycaps 510, the luminous keyboard may have at least two of the third high potential wires 553, at least two of the third low potential wires 554, and at least two of the pad portions 557. As shown in FIG. 9, the at least two of the pad portions 557 are positioned below at two sides of a midline 510M of the each of the keycaps 510, respectively, such that the bottom surface of the keycaps 510 at two sides of the supporting structures 522 can receive illumination of appropriate intensity. Of course, the arrangements of the light sources and the corresponding composite circuit layer 550 are not limited thereto. For example, in some embodiments, the design of the keycaps 510 and the supporting structures 522 keeps their middle area empty of transparent for light, and at this time, even a single light source 560 being disposed under each of the keycaps 510 is enough to uniformly illuminate the entire keycap. The specific understanding to the structural configurations of one type of luminous keyboard has been provided with FIGS. 8A-8D to FIG. 10. However, other types of luminous keyboard may be used.

For example, as shown in FIG. 10, in the luminous keyboard described above, the keycaps 510, the supporting structures 522 of the membrane switch layer 520, the switch electrode layer 521 of the membrane switch layer 520, the base plate 530, and the light source board 540 are disposed sequentially from top to bottom, and the connecting structure 525 of the supporting structure 522 is a snap extending and being folded upwardly from the base plate 530 and being integrated with the base plate 530.

Figure 11:
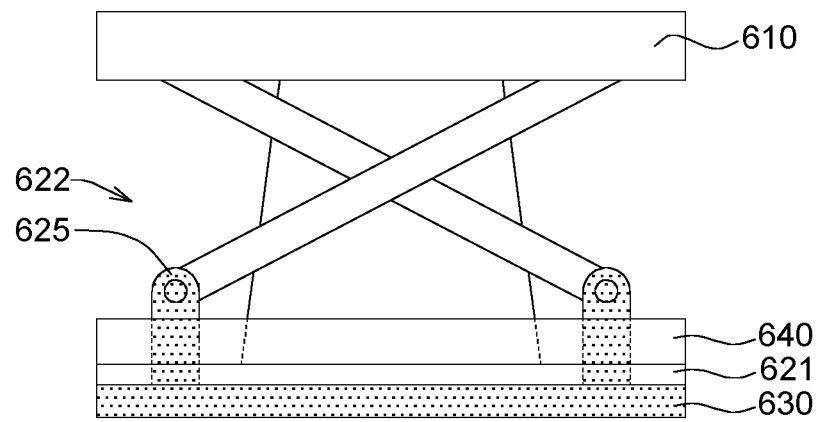
FIG. 11 shows a side view of one key of a luminous keyboard according to some other embodiments.

In a luminous keyboard according to some other embodiments, as shown in FIG. 11, the keycaps 610, the supporting structures 622, the light source board 640, the switch electrode layer 621, and the base plate 630 may be disposed sequentially from top to bottom, and the connecting structure 625 of the supporting structure 622 also is a snap extending from the base plate 630 and being integrated with the base plate 630. This type of luminous keyboard differs from the luminous keyboard of FIG. 10 in the position of the light source board 640, wherein the light source board 640 is positioned on the switch electrode layer 621.

It can be appreciated that the sequence of the switch electrode layer of the membrane switch layer, the base plate with a snap, and the light source board may be arbitrarily arranged. For example, in FIG. 10, the switch electrode layer (521), the base plate (530), and the light source board (540) are disposed sequentially from top to bottom. In FIG. 11, the light source board (640), the switch electrode layer (621), and the base plate (630) are disposed sequentially from top to bottom. In some other embodiments, the base plate, the light source board, and the switch electrode layer are disposed sequentially from top to bottom. In some other embodiments, the switch electrode layer, the light source board, and the base plate are disposed sequentially from top to bottom. In some other embodiments, the base plate, the switch electrode layer, and the light source board are disposed sequentially from top to bottom. In some other embodiments, the light source board, the base plate, and the switch electrode layer are disposed sequentially from top to bottom.

Figure 12:
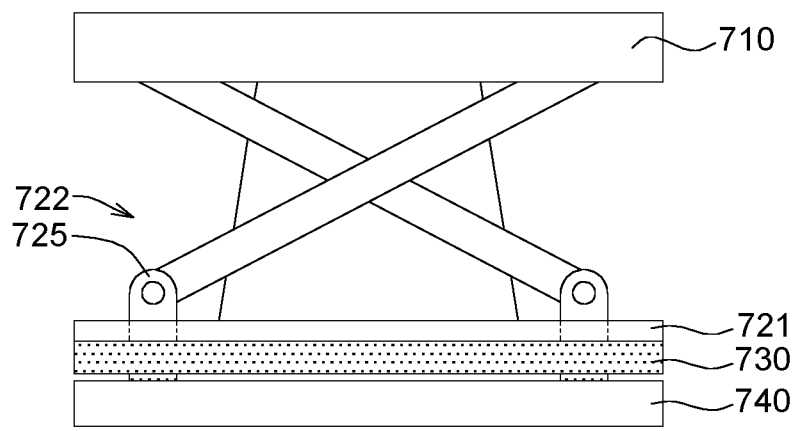
FIG. 12 shows a side view of one key of a luminous keyboard according to some further embodiments.

In a luminous keyboard according to some further embodiments, as shown in FIG. 12, the keycaps 710, the supporting structure 722, the switch electrode layer 721, the base plate 730, and the light source board 740 are disposed sequentially from top to bottom, and the connecting structure 725 of the supporting structure 722 is a plastic connecting component bonded to the base plate 730. The U.S. Pat. No. 8,759,698 has disclosed the background technology about how the plastic connecting component can be bonded to the base plate 730. This type of luminous keyboard differs from the luminous keyboard of FIG. 10 in the design of the connecting structure.

Figure 13:
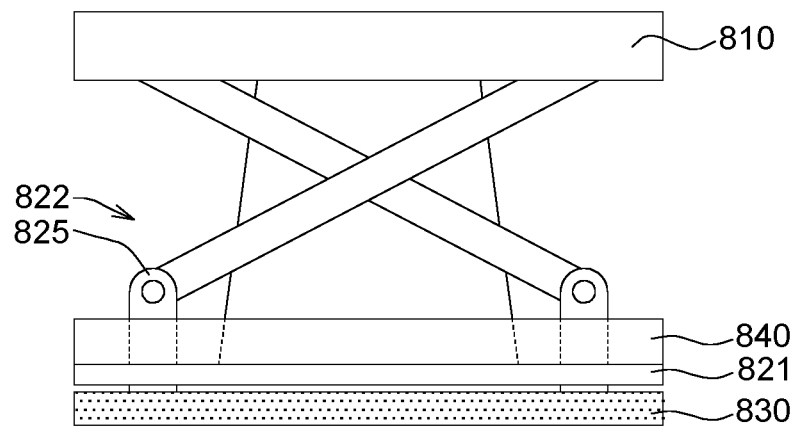
FIG. 13 shows a side view of one key of a luminous keyboard according to still some further embodiments.

In a luminous keyboard according to still some further embodiments, as shown in FIG. 13, the keycaps 810, the supporting structure 822, the light source board 840, the switch electrode layer 821, and the base plate 830 are disposed sequentially from top to bottom, and the connecting structure 825 of the supporting structure 822 is a plastic connecting component bonded to the switch electrode layer 821. This type of luminous keyboard differs from the luminous keyboard of FIG. 12 in the position of the light source board 840 and the arrangement of the connecting structure 825, wherein the light source board 840 is positioned on the switch electrode layer) 821, and the connecting structure 825 is bonded to the switch electrode layer 821 rather than to the base plate 830.

Figure 14:
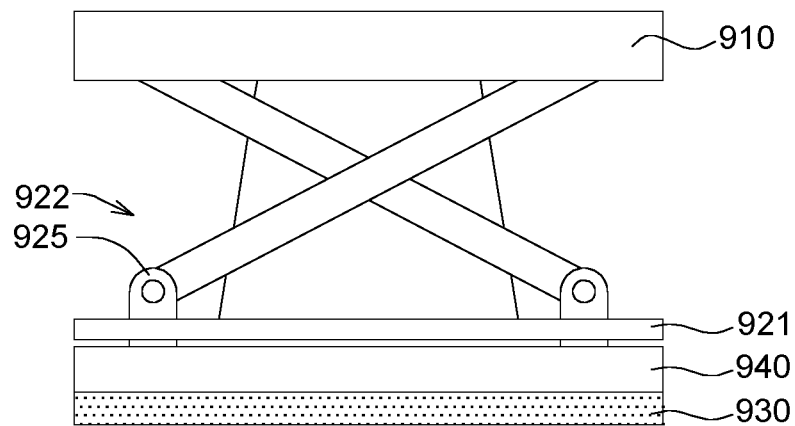
FIG. 14 shows a side view of one key of a luminous keyboard according to yet some further embodiments.

In a luminous keyboard according to yet some further embodiments, as shown in FIG. 14, the keycaps 910, the supporting structure 922, the switch electrode layer 921, the light source board 940, and the base plate 930 are disposed sequentially from top to bottom, and the connecting structure 925 of the supporting structure 922 is a plastic connecting component bonded to the switch electrode layer 921. This type of luminous keyboard differs from the luminous keyboard of FIG. 13 in the position of the light source board 940, wherein the light source board 940 is positioned between the switch electrode layer 921 and the base plate 930.

It can be appreciated that the sequence of the switch electrode layer of the membrane switch layer, the base plate, and the light source board may be arbitrarily arranged. For example, in some other embodiments, the base plate, the light source board, and the switch electrode layer may be disposed sequentially from top to bottom. In some other embodiments, the base plate, the switch electrode layer, and the light source board may be disposed sequentially from top to bottom. In some other embodiments, the light source board, the base plate, and the switch electrode layer may be disposed sequentially from top to bottom. Besides, in each case, the plastic connecting component may be bonded to the switch electrode layer, the base plate, or the light source board.

No matter which type is used, in a luminous keyboard according to the embodiments, under each of the keycaps, a light source is disposed, and thereby the uniformity of illumination can be ensured. Besides, since the light source board is used for illumination, the thickness of the keyboard and the power consumption can be reduced compared to a luminous keyboard using a backlight module having a light guide.

Figure 15:
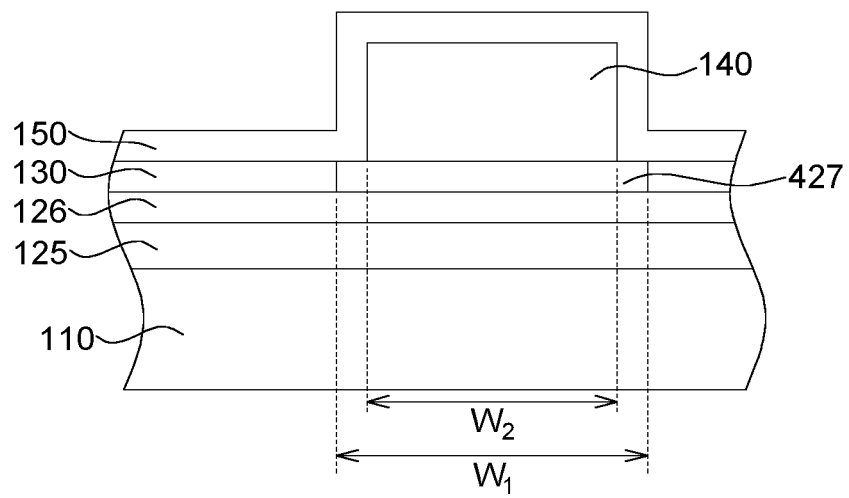
FIG. 15 shows a light source board according to some embodiments.
Figure 16:
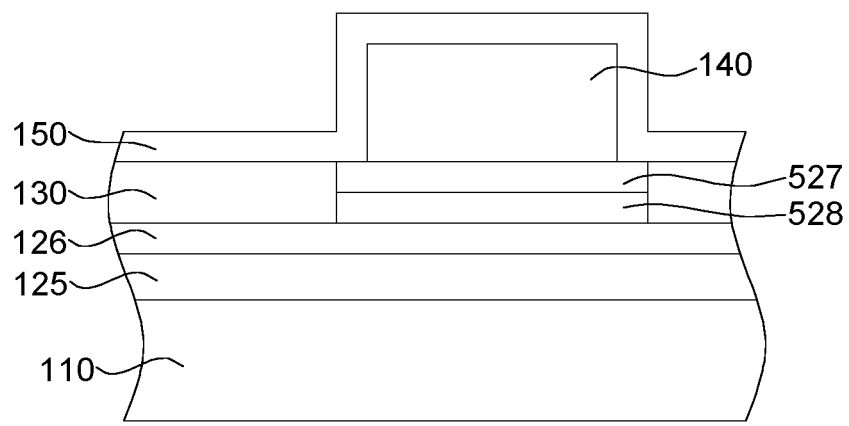
FIG. 16 shows a light source board according to some embodiments.
Figure 17:
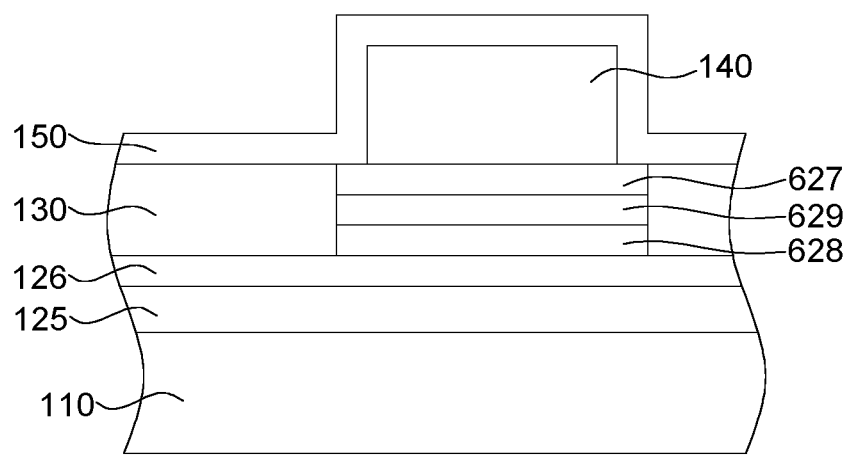
FIG. 17 shows a light source board according to some embodiments.

According to some embodiments of present invention, a single layer or a plurality of layers may be further disposed between the metal conductive layer 126 and the light source 140, as shown in FIGS. 15-17 of the present application.

FIG. 15 is a schematic view of a light source board 400 according to a further embodiment, which illustrates a light source board 400 similar to the light source board 100 of FIGS. 1A-1C, the difference between the light source board 400 and the light source board 100 is in that a metal alloy layer 427 is further disposed between the conductive layer 126 and the light source 140, and other identical or similar features will not be described.

Referring to FIG. 15, the light source board 400 includes a substrate 110, a metal reactive layer 125, a metal conductive layer 126, a metal alloy layer 427, a light source 140, a first protective layer 130, and a second protective layer 150. The metal reactive layer 125, the metal conductive layer 126, the metal alloy layer 427, and the light source 140 are sequentially stacked on the substrate 110. The first protective layer 130 is disposed on the metal conductive layer 126. The second protective layer 150 is disposed on the first protective layer 130, the metal alloy layer 427, and the light source 140. The metal alloy layer 427 and the light source 140 overlap each other in a direction perpendicularly projected to the substrate 110. In one embodiment, the width $W_1$ of the metal alloy layer 427 perpendicularly projected onto the substrate 110 may be greater than the width $W_2$ of the light source 140 perpendicularly projected onto the substrate 110 and less than the width of the metal conductive layer 126 perpendicularly projected onto the substrate 110. The metal alloy layer 427 may be a Sn—Bi type alloy, a Sn—Ag—Cu type alloy, or other suitable materials. The Sn—Bi type alloy is, for example, Sn-57Bi-1.0Ag or Sn—Bi—Sb—N. The Sn—Ag—Cu type alloy is, for example, Sn—Ag—Cu.

Since the metal conductive layer 126 and the light source 140 are not in direct contact with each other, the metal conductive layer 126 is electrically connected to the light source 140 by the metal alloy layer 427. Compared with the embodiment in which the metal conductive layer 126 is in direct contact with the light source 140, under the process temperature equal to or lower than 200° C., the metal alloy layer 427 can have a better surface bonding strength with the light source 140, and the metal alloy layer 427 has good oxidation resistance. Further, the light source board 400 of the present embodiment may include 12 different examples (examples 1-1 to 1-12) as shown in the following Table 1, and the metal reactive layer 125, the metal conductive layer 126 and the metal alloy layer 427 are selected to use a specific material, respectively. In the following examples, since the metal reactive layer 125, the metal conductive layer 126 and the metal alloy layer 427 are individually selected as specific materials, the fixed material arrangement between the layers allows for optimal matching between the layers, and it can be beneficial to mass production. Moreover, it should be understood that this embodiment can be incorporated into any of the embodiments described herein above.

TABLE 1

| example | Metal reactive layer | Metal conductive layer | Metal alloy layer |
|---|---|---|---|
| 1-1 | Silver paste | Cu | Sn—Bi type alloy |
| 1-2 | Silver paste | Ni | Sn—Bi type alloy |
| 1-3 | Silver paste | Ag | Sn—Bi type alloy |
| 1-4 | Copper paste | Cu | Sn—Bi type alloy |
| 1-5 | Copper paste | Ni | Sn—Bi type alloy |
| 1-6 | Copper paste | Ag | Sn—Bi type alloy |
| 1-7 | Silver paste | Cu | Sn—Ag—Cu type alloy |
| 1-8 | Silver paste | Ni | Sn—Ag—Cu type alloy |
| 1-9 | Silver paste | Ag | Sn—Ag—Cu type alloy |
| 1-10 | Copper paste | Cu | Sn—Ag—Cu type alloy |
| 1-11 | Copper paste | Ni | Sn—Ag—Cu type alloy |
| 1-12 | Copper paste | Ag | Sn—Ag—Cu type alloy |

FIG. 16 is a schematic diagram of a light source board 500 according to a further embodiment, which illustrates a light source board 500 similar to the light source board 400 of FIG. 15, the difference between the light source board 500 and the light source board 400 is in that a first metal protective layer 528 is further disposed between the metal conductive layer 126 and the metal alloy layer 527, and other identical or similar features will not be described.

Referring to FIG. 16, the light source board 500 includes a substrate 110, a metal reactive layer 125, a metal conductive layer 126, a first metal protective layer 528, a metal alloy layer 527, a light source 140, a first protective layer 130, and a second protective layer 150. The metal reactive layer 125, the metal conductive layer 126, the first metal protective layer 528, the metal alloy layer 527, and the light source 140 are sequentially stacked on the substrate 110. The first protective layer 130 is disposed on the metal conductive layer 126. The second protective layer 150 is disposed on the first protective layer 130, the metal alloy layer 527, and the light source 140. The metal alloy layer 427 may be a Sn—Bi type alloy, a Sn—Ag—Cu type alloy or other suitable materials. The Sn—Bi type alloy is, for example, Sn-57Bi-1.0Ag or Sn—Bi—Sb—N. The Sn—Ag—Cu type alloy is, for example, Sn—Ag—Cu. The material of the first metal protective layer 528 may be gold (Au), nickel (Ni) or other suitable material to provide high hardness.

Compared with the embodiment of the light source board 400, since the light source board 500 of the present embodiment is further provided with a first metal protection layer 528 between the metal conductive layer 126 and the metal alloy layer 527, good stability and chemical resistance can be provided, the structure below can be protected and is less likely to react with the external air. Further, the light source board 500 of the present embodiment may include 20 different examples (examples 2-1 to 2-20) as shown in the following Table 2, the metal reactive layer 125, the metal conductive layer 126, the first metal protective layer 528 and metal alloy layer 527 are selected to use a specific material, respectively. In the following examples, since the metal reactive layer 125, the metal conductive layer 126, the first metal protective layer 528, and the metal alloy layer 527 are individually selected as specific materials, and the fixed material arrangement between the layers allows for optimal matching between the layers and can be beneficial for mass production. Moreover, it should be understood that this embodiment can be incorporated into any of the embodiments described herein above.

TABLE 2

| example | Metal reactive layer | Metal conductive layer | First metal protective layer | Metal alloy layer |
|---|---|---|---|---|
| 2-1 | Silver paste | Cu | Au | Sn—Bi type alloy |
| 2-2 | Silver paste | Ni | Au | Sn—Bi type alloy |
| 2-3 | Silver paste | Ag | Au | Sn—Bi type alloy |
| 2-4 | Silver paste | Cu | Ni | Sn—Bi type alloy |
| 2-5 | Silver paste | Ag | Ni | Sn—Bi type alloy |
| 2-6 | Copper paste | Cu | Au | Sn—Bi type alloy |
| 2-7 | Copper paste | Ni | Au | Sn—Bi type alloy |
| 2-8 | Copper paste | Ag | Au | Sn—Bi type alloy |
| 2-9 | Copper paste | Cu | Ni | Sn—Bi type alloy |
| 2-10 | Copper paste | Ag | Ni | Sn—Bi type alloy |
| 2-11 | Silver paste | Cu | Au | Sn—Ag—Cu type alloy |
| 2-12 | Silver paste | Ni | Au | Sn—Ag—Cu type alloy |
| 2-13 | Silver paste | Ag | Au | Sn—Ag—Cu type alloy |
| 2-14 | Silver paste | Cu | Ni | Sn—Ag—Cu type alloy |
| 2-15 | Silver paste | Ag | Ni | Sn—Ag—Cu type alloy |
| 2-16 | Copper paste | Cu | Au | Sn—Ag—Cu type alloy |
| 2-17 | Copper paste | Ni | Au | Sn—Ag—Cu type alloy |
| 2-18 | Copper paste | Ag | Au | Sn—Ag—Cu type alloy |
| 2-19 | Copper paste | Cu | Ni | Sn—Ag—Cu type alloy |
| 2-20 | Copper paste | Ag | Ni | Sn—Ag—Cu type alloy |

FIG. 17 is a schematic view of a light source board 600 according to some further embodiments, which illustrates a light source board 600 similar to the light source board 500 of FIG. 16, the difference between the light source board 600 and the light source board 500 is in that a second metal protective layer 629 is further disposed between the metal alloy layer 627 and the first metal protective layer 628, and other identical or similar features will not be described.

Referring to FIG. 17, the light source board 600 includes a substrate 110, a metal reactive layer 125, a metal conductive layer 126, a first metal protective layer 628, a second metal protective layer 629, a metal alloy layer 627, a light source 140, and a first protective layer 130 and a second protective layer 150. The metal reactive layer 125, the metal conductive layer 126, the first metal protective layer 628, the second metal protective layer 629, the metal alloy layer 627, and the light source 140 are sequentially stacked on the substrate 110. The first protective layer 130 is disposed on the metal conductive layer 126. The second protective layer 150 is disposed on the first protective layer 130, the metal alloy layer 627, and the light source 140. The metal alloy layer 627 may be a Sn—Bi type alloy, a Sn—Ag—Cu type alloy, or other suitable materials. The Sn—Bi type alloy is, for example, Sn-57Bi-1.0Ag or Sn—Bi—Sb—N. The Sn—Ag—Cu type alloy is, for example, Sn—Ag—Cu. The material of the first metal protective layer 628 may be nickel or other suitable material, which provides high hardness, stability and chemical resistance. The material of the second metal protective layer 629 may be gold or other suitable material, which can increase corrosion resistance, and has oxidation resistance and chemical resistance. The second metal protective layer 629 is closer to the light source than the first metal protective layer 628, and is more likely to be in contact with the external air, so the oxidation resistance of the second metal protective layer 629 can be higher than that of the first metal protective layer 628.

Compared with the embodiment of the light source board 500, since the light source board 600 of the present embodiment has two layers of the metal protective layers (that is, the first metal protective layer 628 and the second metal protective layer 629), which provides better corrosion resistance, oxidation resistance and chemical resistance, protects the underlying structure from corrosion by chemicals, and is less susceptible to react with external air. Further, the light source board 600 of the present embodiment may include eight different examples (examples 3-1 to 3-8) as shown in the following Table 3, the metal reactive layer 125, the metal conductive layer 126, the first metal protective layer 628, the second metal protective layer 629, and the metal alloy layer 627 are selected to use a specific material, respectively. In the following examples, since the metal reactive layer 125, the metal conductive layer 126, the first metal protective layer 628, the second metal protective layer 629, and the metal alloy layer 627 are individually selected as specific materials, and the fixed material arrangement between the layers allows for optimal matching between the layers and can be beneficial for mass production. Moreover, it should be understood that this embodiment can be incorporated into any of the embodiments described herein above.

TABLE 3

| example | Metal reactive layer | Metal conductive layer | First metal protective layer | Second metal protective layer | Metal alloy layer |
|---|---|---|---|---|---|
| 3-1 | Silver paste | Ag | Ni | Au | Sn—Bi type alloy |
| 3-2 | Silver paste | Cu | Ni | Au | Sn—Bi type alloy |
| 3-3 | Copper paste | Ag | Ni | Au | Sn—Bi type alloy |
| 3-4 | Copper paste | Cu | Ni | Au | Sn—Bi type alloy |
| 3-5 | Silver paste | Ag | Ni | Au | Sn—Ag—Cu type alloy |
| 3-6 | Silver paste | Cu | Ni | Au | Sn—Ag—Cu type alloy |
| 3-7 | Copper paste | Ag | Ni | Au | Sn—Ag—Cu type alloy |
| 3-8 | Copper paste | Cu | Ni | Au | Sn—Ag—Cu type alloy |

In a light source board according to an embodiment of the present invention, since the metal alloy layer is disposed between the metal conductive layer and the light source, it can enhance the surface bonding strength of a light source at the temperature equal to or below 200° C., and can also provide better oxidation resistance in comparison with the embodiment having no metal alloy layer between the metal conductive layer and the light source. Furthermore, each layer of the light source board of the present invention (for example, a metal reactive layer, a metal conductive layer, a first metal protective layer, a second metal protective layer or a metal alloy layer) is selected from a specific material, and the fixed material arrangement between the layers allows for optimal matching between the layers and can be beneficial for mass production.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light source board, comprising:
a substrate;
a metal reactive layer disposed on the substrate;
a metal conductive layer disposed on the metal reactive layer;
a metal alloy layer disposed on the metal conductive layer; and
at least one light source disposed on the metal alloy layer, wherein a material of the metal alloy layer is a Sn—Bi type alloy or a Sn—Ag—Cu type alloy, and arrangements of materials of the metal reactive layer and the metal conductive layer are respectively an arrangement of silver paste and copper, an arrangement of silver paste and nickel, an arrangement of silver paste and silver, an arrangement of copper paste and copper, an arrangement of copper paste and nickel, or an arrangement of copper paste and silver,
wherein a conductivity of the metal conductive layer is higher than a conductivity of the metal reactive layer.

2. The light source board according to claim 1, wherein the Sn—Bi type alloy is Sn-57Bi-1.0Ag or Sn—Bi—Sb—N, and the Sn—Ag—Cu type alloy is Sn—Ag—Cu.

3. The light source board according to claim 1, further comprising a first protective layer and a second protective layer, wherein the first protective layer is disposed on the metal conductive layer, and the second protective layer is disposed on the first protective layer, the metal alloy layer and the at least one source.

4. The light source board according to claim 1, further comprising a composite circuit layer disposed on the substrate and a first protective layer disposed on the composite circuit layer, wherein the composite circuit layer comprising:
the metal reactive layer, and
the metal conductive layer stacked on the metal reactive layer, and
the composite circuit layer having:
a wire portion formed of at least the metal reactive layer, and
a plurality of pad portions each formed of at least the metal reactive layer and the metal conductive layer, wherein the wire portion is electrically coupled to the plurality of pad portions;
wherein the substrate has a long side, a first short side, and a second short side, the at least one light source has a plurality of light sources disposed on the pad portions, respectively.

5. The light source board according to claim 4, further having a wire tail portion, wherein the composite circuit layer comprises:
a plurality of first high potential wires extending from the wire tail portion to a middle area of the first short side;
a plurality of second high potential wires extending in a manner substantially parallel to the long side from the middle area of the first short side to proximity of the pad portions;
a plurality of second low potential wires extending in a manner substantially parallel to the long side from the proximity of the pad portions to a middle area of the second short side; and
a plurality of first low potential wires extending from the middle area of the second short side to the wire tail portion.

6. The light source board according to claim 4, wherein the substrate is formed of a flexible material, and wherein the light source board further has a wire tail portion, the wire tail portion has a plurality of extended wires and a portion to be bent, the substrate is able to be bent by an external force at the portion to be bent, the extended wires is formed of only the metal reactive layer in the portion to be bent, and the metal conductive layer unextend in the portion to be bent.

7. The light source board according to claim 4, wherein the composite circuit layer further comprises a resistance increasing portion without the metal conductive layer, with an increased length of the metal reactive layer therein or a reduced width of the metal reactive layer therein, and/or with a resistance device.

8. A light source board, comprising:
a substrate;
a metal reactive layer disposed on the substrate;
a metal conductive layer disposed on the metal reactive layer;
a first metal protective layer disposed on the metal conductive layer;
a metal alloy layer disposed on the first metal protective layer; and
at least one light source disposed on the metal alloy layer, wherein a material of the metal alloy layer is a Sn—Bi type alloy or a Sn—Ag—Cu type alloy, and arrangements of materials of the metal reactive layer, the metal conductive layer and the first metal protective layer are respectively an arrangement of silver paste, copper and gold, an arrangement of silver paste, nickel and gold, an arrangement of silver paste, silver and gold, an arrangement of silver paste, copper and nickel, an arrangement of silver paste, silver and nickel, an arrangement of copper paste, copper and gold, or an arrangement of copper paste, nickel and gold, an arrangement of copper paste, silver and gold, and arrangement of copper paste, copper and nickel, an arrangement of copper paste, silver and nickel.

9. The light source board according to claim 8, wherein the Sn—Bi type alloy is Sn-57Bi-1.0Ag or Sn—Bi—Sb—N, and the Sn—Ag—Cu type alloy is Sn—Ag—Cu.

10. The light source board according to claim 8, further comprising a first protective layer and a second protective layer, wherein the first protective layer is disposed on the metal conductive layer, and the second protective layer is disposed on the first protective layer, the metal alloy layer and the at least one source.

11. The light source board according to claim 8, further comprising a composite circuit layer disposed on the substrate and a first protective layer disposed on the composite circuit layer, wherein the composite circuit layer comprising:
the metal reactive layer, and
the metal conductive layer stacked on the metal reactive layer, wherein a conductivity of the metal conductive layer is higher than a conductivity of the metal reactive layer, and
the composite circuit layer having:
a wire portion formed of at least the metal reactive layer, and
a plurality of pad portions each formed of at least the metal reactive layer and the metal conductive layer, wherein the wire portion is electrically coupled to the plurality of pad portions;
wherein the substrate has a long side, a first short side, and a second short side, the at least one light source has a plurality of light sources disposed on the pad portions, respectively.

12. The light source board according to claim 11, further having a wire tail portion, wherein the composite circuit layer comprises:
- a plurality of first high potential wires extending from the wire tail portion to a middle area of the first short side;
- a plurality of second high potential wires extending in a manner substantially parallel to the long side from the middle area of the first short side to proximity of the pad portions;
- a plurality of second low potential wires extending in a manner substantially parallel to the long side from the proximity of the pad portions to a middle area of the second short side; and
- a plurality of first low potential wires extending from the middle area of the second short side to the wire tail portion.

13. The light source board according to claim 11, wherein the substrate is formed of a flexible material, and wherein the light source board further has a wire tail portion, the wire tail portion has a plurality of extended wires and a portion to be bent, the substrate is able to be bent by an external force at the portion to be bent, the extended wires is formed of only the metal reactive layer in the portion to be bent, and the metal conductive layer unextend in the portion to be bent.

14. The light source board according to claim 11, wherein the composite circuit layer further comprises a resistance increasing portion without the metal conductive layer, with an increased length of the metal reactive layer therein or a reduced width of the metal reactive layer therein, and/or with a resistance device.

15. A light source board, comprising:
- a substrate;
- a metal reactive layer disposed on the substrate;
- a metal conductive layer disposed on the metal reactive layer;
- a first metal protective layer disposed on the metal conductive layer;
- a second metal protective layer disposed on the first metal protective layer;
- a metal alloy layer disposed on the second metal protective layer; and
- at least one light source disposed on the metal alloy layer, wherein a material of the metal alloy layer is a Sn—Bi type alloy or a Sn—Ag—Cu type alloy, and arrangements of materials of the metal reactive layer, the metal conductive layer, the first metal protective layer and the second metal protective layer are respectively an arrangement of silver paste, silver, nickel and gold, an arrangement of silver paste, copper, nickel and gold, an arrangement of copper paste, silver, nickel and gold, or an arrangement of copper paste, copper, nickel and gold.

16. The light source board according to claim 15, wherein the Sn—Bi type alloy is Sn-57Bi-1.0Ag or Sn—Bi—Sb—N, and the Sn—Ag—Cu type alloy is Sn—Ag—Cu.

17. The light source board according to claim 15, further comprising a first protective layer and a second protective layer, wherein the first protective layer is disposed on the metal conductive layer, and the second protective layer is disposed on the first protective layer, the metal alloy layer and the at least one source.

18. The light source board according to claim 15, further comprising a composite circuit layer disposed on the substrate and a first protective layer disposed on the composite circuit layer, wherein the composite circuit layer comprising:
- the metal reactive layer, and
- the metal conductive layer stacked on the metal reactive layer, wherein a conductivity of the metal conductive layer is higher than a conductivity of the metal reactive layer, and the composite circuit layer having:
- a wire portion formed of at least the metal reactive layer, and
- a plurality of pad portions each formed of at least the metal reactive layer and the metal conductive layer, wherein the wire portion is electrically coupled to the plurality of pad portions;
- wherein the substrate has a long side, a first short side, and a second short side, the at least one light source has a plurality of light sources disposed on the pad portions, respectively.

19. The light source board according to claim 18, further having a wire tail portion, wherein the composite circuit layer comprises:
- a plurality of first high potential wires extending from the wire tail portion to a middle area of the first short side;
- a plurality of second high potential wires extending in a manner substantially parallel to the long side from the middle area of the first short side to proximity of the pad portions;
- a plurality of second low potential wires extending in a manner substantially parallel to the long side from the proximity of the pad portions to a middle area of the second short side; and
- a plurality of first low potential wires extending from the middle area of the second short side to the wire tail portion.

20. The light source board according to claim 18, wherein the substrate is formed of a flexible material, and wherein the light source board further has a wire tail portion, the wire tail portion has a plurality of extended wires and a portion to be bent, the substrate is able to be bent by an external force at the portion to be bent, the extended wires is formed of only the metal reactive layer in the portion to be bent, and the metal conductive layer unextend in the portion to be bent.

21. The light source board according to claim 18, wherein the composite circuit layer further comprises a resistance increasing portion without the metal conductive layer, with an increased length of the metal reactive layer therein or a reduced width of the metal reactive layer therein, and/or with a resistance device.

* * * * *